United States Patent [19]

Kodama et al.

[11] Patent Number: 4,866,325

[45] Date of Patent: Sep. 12, 1989

[54] SURFACE ACOUSTIC WAVE TRANSDUCER

[75] Inventors: Toshikazu Kodama; Koji Sato, both of Yokohama, Japan

[73] Assignee: Kabushiki Kaisha Toshiba, Kawasaki, Japan

[21] Appl. No.: 130,327

[22] Filed: Dec. 8, 1987

Related U.S. Application Data

[63] Continuation of Ser. No. 935,635, Nov. 25, 1986, abandoned, which is a continuation of Ser. No. 686,669, Dec. 27, 1984, abandoned.

[30] Foreign Application Priority Data

Dec. 28, 1983 [JP] Japan ................. 58-245160

[51] Int. Cl.$^4$ ............................................. H01L 41/08
[52] U.S. Cl. ................................. 310/313 B; 310/313 C
[58] Field of Search ................ 310/313; 333/193–196, 333/153–155

[56] References Cited

U.S. PATENT DOCUMENTS

| | | | |
|---|---|---|---|
| 3,675,054 | 7/1972 | Jones et al. | 310/313 B |
| 3,723,919 | 3/1973 | Adler | 310/313 B X |
| 3,727,155 | 4/1973 | DeVries | 310/313 B |
| 3,803,520 | 4/1974 | Bristol et al. | 310/313 B X |
| 3,984,791 | 10/1976 | Deacon | 310/313 B X |
| 4,162,465 | 7/1979 | Hunsinger et al. | 310/313 D X |
| 4,206,380 | 6/1980 | Hazama et al. | 310/313 B |
| 4,406,964 | 9/1983 | Chiba et al. | 310/313 B |
| 4,429,246 | 1/1984 | Miyajima | 310/313 B |
| 4,491,757 | 1/1985 | Hartmann | 310/313 B |
| 4,535,265 | 8/1985 | Kodama et al. | 310/313 D X |

FOREIGN PATENT DOCUMENTS 54-85884 2/1981 Japan .
58-84517 5/1983 Japan .

OTHER PUBLICATIONS

Hartmann et al; "An Analysis of SAW Interdigital Transducers with Internal Reflections and the Application to the Design of Single-Phase Unidirectional Transducers", IEEE, 1982, pp. 40–45.

M. F. Lewis, "Group-Type Unidirectional SAW Devices Employing Intra-Transducer Reflector Banks", Electronics Letters, vol. 19, No. 25/26, Dec. 1983, p. 1085.

Primary Examiner—Mark O. Budd
Attorney, Agent, or Firm—Foley & Lardner, Schwartz, Jeffery, Schwaab, Mack, Blumenthal & Evans

[57] ABSTRACT

The surface acoustic wave transducer in accordance with the present invention comprises a piezo-electric substrate, and a first type electrode-strips set which generates an electric reflection alone with no acoustic reflection and a second type electrode-strips set which generates both of an electric reflection and an acoustic reflection, both types being formed on the piezo-electric substrate. The first type electrode-strips set is formed by electrode strips with approximate width of $\frac{1}{8}$ of the wavelength of the surface acoustic wave, while the second type electrode-strips set is formed by electrode strips with approximate width of $\frac{1}{8}$ and approximate width of $\frac{3}{8}$ of the wavelength of the surface acoustic wave.

3 Claims, 7 Drawing Sheets

SURFACE ACOUSTIC WAVE TRANSDUCER

This application is a continuation of application Ser. No. 935,635, filed Nov. 25, 1986, which is a continuation of Ser. No. 686,669, filed Dec. 27, 1984, now abandoned.

BACKGROUND OF THE INVENTION

1. Field of the Invention

The present invention relates to a low-loss acoustic surface wave transducer with improved spurious reflection components.

2. Description of the Art

As a surface acoustic wave transducer, a type with a construction in which a first and a second comb-shaped electrodes are interdigitated with a certain gap on the surface of a piezoelectric substrate (I.D.T.) has been practically used. In such a device it is possible to realize a variety of frequency characterstics by varying the pitch and the interdigitated length of the electrode strips of an IDT.

As spurious components which invariably are troublesome in various surface acoustic wave devices constructed by utilizing such an IDT, there are spurious reflection components of the surface acoustic wave due to the IDT. When a filter or a delay line is actually constructed by using such an IDT, these spurious reflection components appear in the form of the triple transit echo (TTE), acting as a cause for deteriorating the characteristic of such a device markedly.

The factors of the spurious reflection components are the reflection components due to the difference in the acoustic impedances of the electrode portion and the gap portion of the IDT (referred to as $R_A$ hereafter) and the reflection components due to the electric re-excitation of the IDT (Referred to as $R_E$ hereafter).

Therefore, it will be seen that in order to remove the spurious reflection components it is necessary only to cancel the reflection components $R_A$ and $R_E$ by giving them opposite phases.

In the past, there has been disclosed in Japanese Patent Publication No. 58-84517 a transducer which is arranged to have the reflection components $R_A$ due to the acoustic impedance difference and the reflection components $R_E$ due to the electric re-excitation cancel each other based on the above technique. The transducer includes a piezo-electric substrate on which a first comb-shaped electrode and a second comb-shaped electrode are formed. The electrode-strips sets of the transducer comprise a first type of electrode-strips set A which generates the electric reflection $R_E$ but no acoustic reflection $R_A$, and a second type electrode-strips set B which generates both of the electric reflection $R_E$ and the acoustic reflection $R_A$. The strip widths of the first type of electrode-strips set A are set at $\lambda/8$ and $5\lambda/8$, while the strip widths of the second type electrode-strips set B are set as a combination of $\lambda/8$ and $3\lambda/8$, where $\lambda$ is the wavelength of the surface acoustic wave.

The region covered by the electrode type B forms the shape of a triangle. That is, since the electric reflection is generated at both regions A and B, the wave form on the time axis of the resultant electric reflection characteristic of the IDT becomes the shape of a triangle which represents the result of the self-convolution of a quadrangle. Therefore, to cancel out the electric reflection $R_E$ at all the points on the time axis it is sufficient to choose the wave form of the acoustic reflection $R_A$ as a triangle with the shape as the triangular region of the electrode type B. Translated in terms of an event on the frequency axis, it is required that the frequency-amplitude characterstic of the acoustic reflection $R_a$ and the frequency-amplitude characteristic of the electric reflection $R_E$ be arranged identically over a wide range of frequency. In other words, when a filter is constructed by an IDT with the above range of frequency, it should be possible to restrain TTE over a wide range of frequency. However, when the overall reflection characteristic is examined by an actually constructed IDT with the above structure, it was observed that the overall reflection charcteristic did not disappear on the entire range of the time axis but left spurious components over small time ranges corresponding to the vicinity of the extremities of the IDT.

SUMMARY OF THE INVENTION

An object of the present invention is to provide a surface acoustic wave transducer with an overall characteristic that has no spurious components over a wide range of frequency.

Another object of the present invention is to provide a surface acoustic wave transducer which is capable of realizing a low-loss filter with extremely few ripples within the frequency band.

Still another object of the present invention is to provide a surface acoustic wave transducer which is capable of reducing the spurious reflections from the portions of extremities of the electrode.

Briefly described, these and other objects of the present invention are accomplished by the provision of an improved surface acoustic wave transducer in which the first type of electrode-strips set A which induces the elecrtric reflection $R_E$ alone and no acoustic reflection $R_A$ is constructed with strips of width $\lambda/8$, while the second type electrode-strips set B which induces both of the elecric and acoustic reflections is constructed with strips of widths $\lambda/8$ and $3\lambda/8$.

BRIEF DESCRIPTION OF THE DRAWING

These and other objects, features and advantages of the present invention will be more apparent from the following description of a preferred embodiment, taken in conjunction with the accompanying drawings, in which.

DESCRIPTION OF THE PREFERRED EMBODIMENTS

To facilitate the understanding of the present invention, a brief reference will be made to a related surface acoustic wave transducer illustrated in FIGS. 1a and 1b.

Figure 1A:
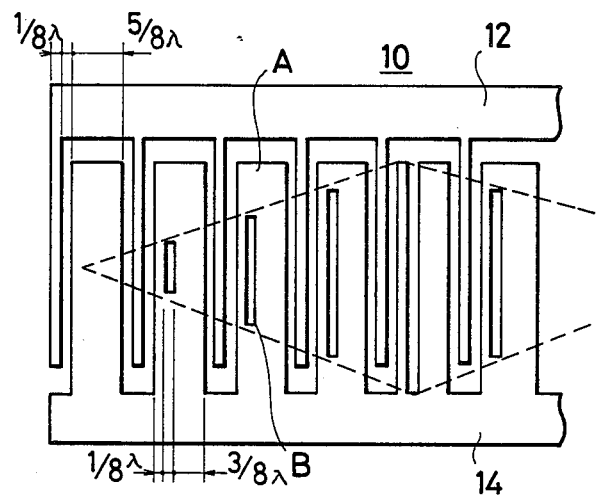
FIGS. 1a and 1b are front elevational views of a related surface acoustic wave transducer.
Figure 1B:
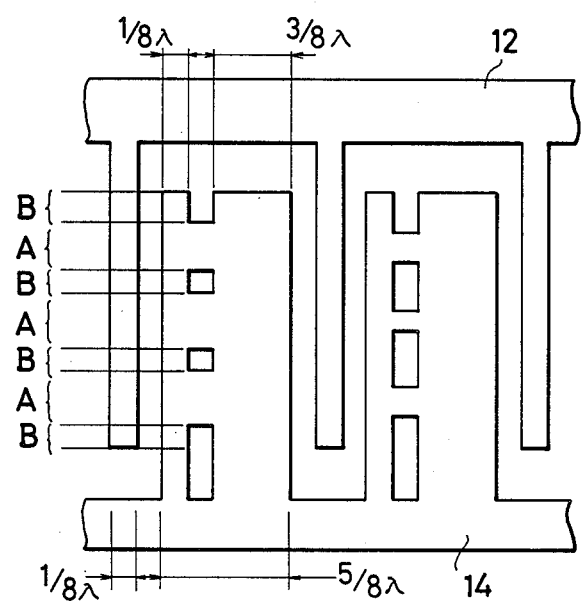

Referring to FIG. 1a, this prior art surface acoustic wave transducer includes a substrate 10 made of a piezo-electric material, and a first comb-shaped electrode 12 and a second comb-shaped electrode 14 interdigitated with the first electrode 12 on the piezo-electric substrate 10. The electrode-strip pairs of the transducer comprises a first type electrode-strip set A which generates the electric reflection $R_E$ alone with no acoustic reflection $R_A$, and a triangular second type electrode-strip set B which generates both of the electric and acoustic reflections. The strip widths of the first type electrode-strip pair A are arranged to be $\lambda/8$ and $5\lambda/8$, and the strip widths of the second type electrode-strip pair B are arranged to be a combination of $\lambda/8$ and $3\lambda/8$, where $\lambda$ is the wavelength of the surface acoustic wave. FIG. 1b show a modification of the device in FIG. 1a in which the region of electrode type B is distributed in the direction of interdigitation width, or the direction perpendicular to the propagation direction of the surface acoustic wave. In FIG. 1a, the reason for arranging a triangular shape for the region of electrode type B may be explained in the following manner. Namely, in the case of the figure, due to the fact that the electric reflection is contributed from both regions of the electrode types A and B, the wave form on the time axis of the resultant electric reflection characteristic becomes triangular in shape which represents the result of the self-convolution of a quadrangle. Therefore, in order to cancel out the electric reflection at all points on the entire time axis, it is sufficient to choose the wave form of the acoustic reflection in the form of an identical triangle. Translated in terms of an event on the frequency axis, it is required that the frequency-amplitude characteristic of the acoustic reflection $R_A$ and the frequency-amplitude characteristic of the electric reflection be arranged identically over a wide range of frequency. In other words, it suggests that it is possible to restrain TTE over a wide range of frequency when a filter is made by an IDT with such a construction.

Figure 2:
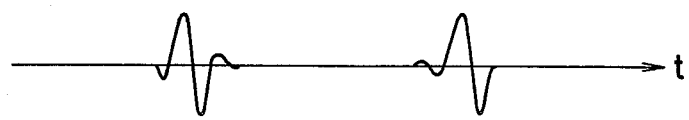
FIG. 2 is the diagram illustrating the reflection wave from for the surface acoustic wave transducers shown in FIG. 1.

However, when the overall reflection characterstic is examined by actually constructing an IDT as shown in FIG. 1a, it was learned, as shown in FIG. 2, that the overall reflection characteristic did not vanish over the entire range of the time axis, with spurious components over small time ranges corresponding to the vicinity of the extremities of the IDT.

The present invention is aimed at resolving such problems, and it will be described in what follows by referring to FIGS. 3 to 9.

Figure 3:
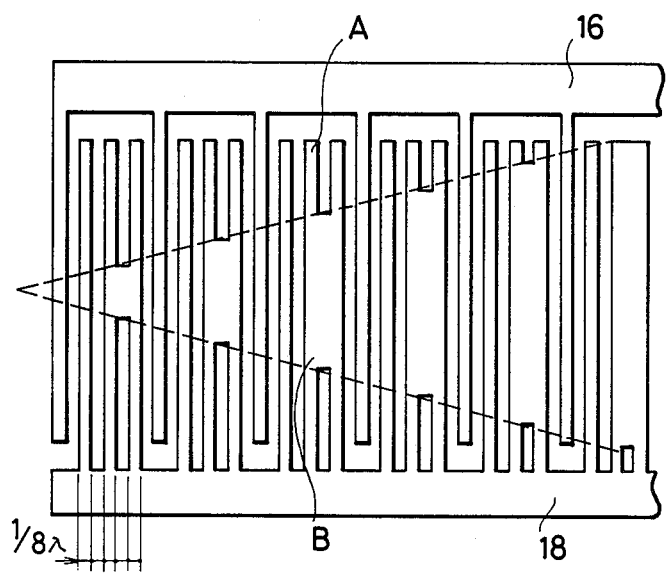
FIG. 3 is the front elevational view of a surface acoustic wave transducer according to a first embodiment of the present invention.
Figure 4A:
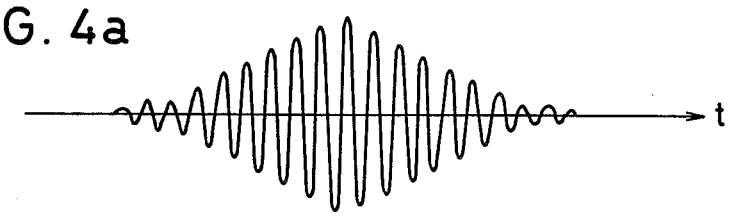
FIGS. 4a to 4c are the diagrams illustrating the acoustic reflection wave forms of the surface acoustic wave transducers of the present invention and of the art.
Figure 4B:
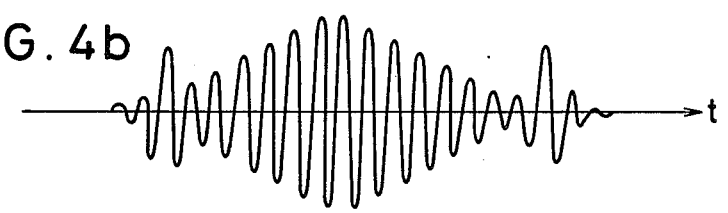

Referring to FIG. 3, the electrode-strips pairs of this transducer are constructed by mutually interdigitating the electrode strips of a first comb-shaped electrode 16 and a second comb-shaped electrode 18. As shown in the figure, the electrode-strip pairs comprise the region of a first type electrode-strip set A (a first arrangement region) which generates the electric reflection components $R_E$ alone with no acoustic reflection components $R_A$, and the triangular region of a second type electrode-strip set B (a second arrangement region) which generates both of the electric and acoustic reflection components $R_E$, $R_A$. The region of the first type electrode-strip set A is construced by strips with a width of $\lambda/8$ and the region of the second type electrode-strip set B is constructed by strips of widths $\lambda/8$ and $3\lambda/8$. As seen in FIG. 3, the comb-shaped electrode 18 has first, second and third electrode strips interdigitated between the electrode strips of the comb-shaped electrode 16. The second and third electrode strips of the second comb-shaped electrode 18 have parts connected together along their lengths. The unconnected parts of the second and third electrode strips as well as the part of the electrode strip of the comb-shaped electrode 16 and parts of the first electrode strip of the comb-shaped electrode 18 outside of the dotted triangle form the first arrangement region. The second arrangement region is formed by the other parts of the electrode strip of the first comb-shaped electrode, the other parts of the first electrode strip of the second comb-shaped electrode and the connected parts of the second and third electrodes, e.g., the region within the dotted triangle. The result of measurement of the acoustic reflection characteristic of an actual transducer constructed with the above structure is the wave form as shown in FIG. 4a. It should be mentioned that the measurement of the acoustic reflection characteristic was made under the state of no electric reflection by short-circuiting the electric terminals 16 and 18. For comparison, the wave form of the acoustic reflection in the case of construction shown in FIG. 1a is illustrated in FIG. 4b. As seen from these figures, in the device there is produced conspicuous spurious reflections in the vicinity of the extremities of the electrode, whereas according to the present invention a reflection wave form with an almost ideal triangular shape is obtained. The reason for this may be explained as the following.

Namely, according to the construction, a considerable perturbation effect on the surface acoustic wave is created due to the electrode strips with a large width of $5\lambda/8$ for the region of the electrode type A. Then, because of a large difference in the displacement distribution of the surface acoustic wave occurring between the region where no IDT exists and the region of the IDT, a mode mismatch arises at the extremity portions of the IDT. It may be considered that the spurious reflection components increase as a result. By contrast, according to the present invention, it becomes possible to reduce markedly the spurious reflection components at the extremities of the electrode because of the reduction in perturbation due to the construction of the region of electrode type A with electrode strips of narrower width $\lambda/8$.

Next, description will be made of another embodiment according to the present invention.

Figure 4C:
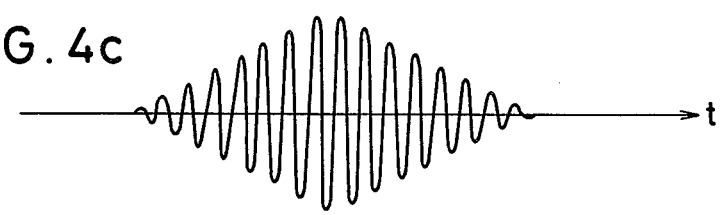
Figure 5:
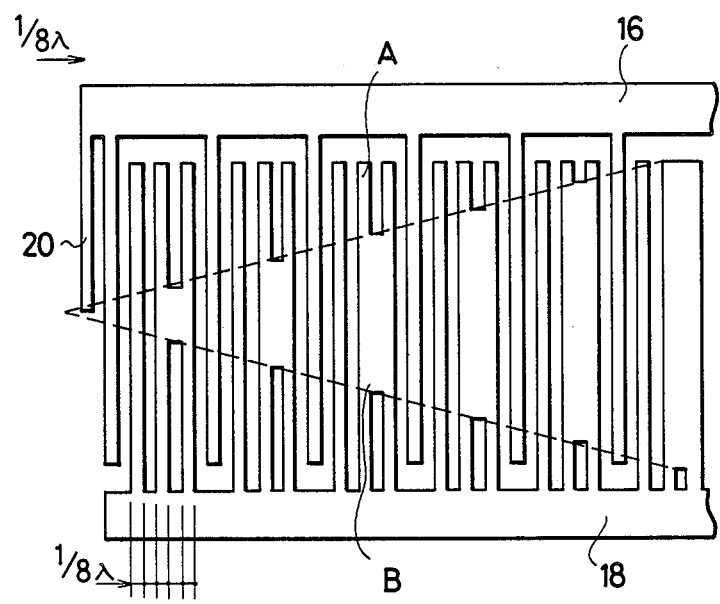
FIG. 5 is a front elevation view illustrating the electrode construction of a second embodiment in accordance with the present invention.

The transducer shown in FIG. 5 is basically similar to the embodiment given in FIG. 3, with a difference in that one electrode strip of width $\lambda/8$ is added to one end of the IDT up to the length of about one half of the interdigitation width. The result of measurement on the acoustic reflection characteristic of the transducer with this additional electrode strip 20 is shown by FIG. 4c. As seen from the figure, there is obtained a characteristic with smaller spurious components at the electrode extremities compared with FIG. 4a. The reason for this may be understood in the following way. Namely, a total path difference of $\lambda/2$ in back and forth is created between the waves that propagate in the upper and lower halves of the IDT due to the arrangement of the added electrode strip 20. Then, the spurious reflection which is still remaining in the embodiment shown in FIG. 3 is made by the new arrangement to be given opposite phases to the reflected waves in the upper and lower halves of the IDT to produce a mutual cancellation.

Figure 6:
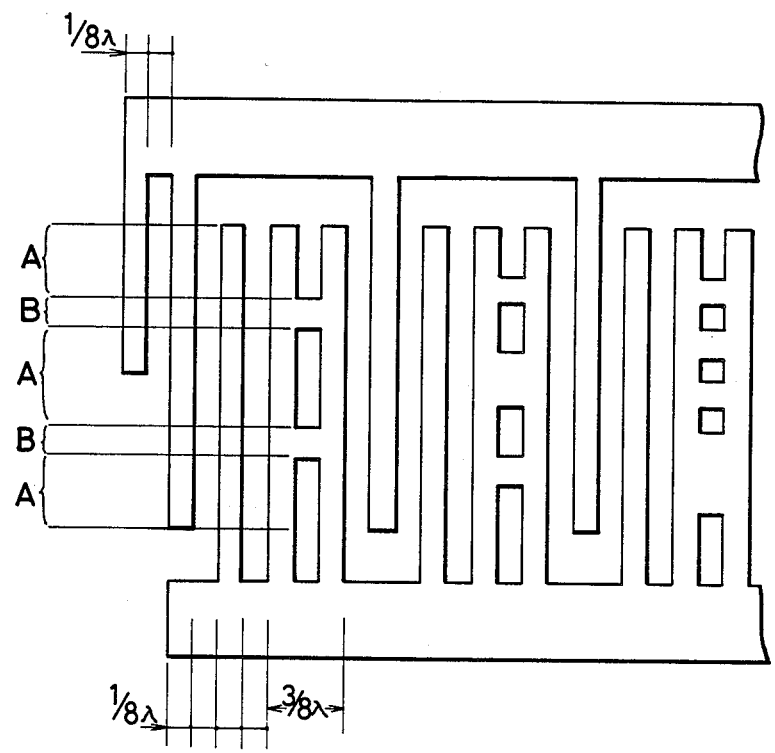
FIG. 6 is a front elevational view illustrating the electrode construction of a third embodiment in accordance with the present invention.

The transducer shown in FIG. 6 is another embodiment according to the present invention. The transducer is arranged such that the first type electrode-strip set A and the second type electrode-strip set B in FIG. 5 are distributed in the interdigitation width of the electrode strips, resulting in an effect of a uniform amplitude in the direction of the interdigitation length. As a result, the cancellation effect of the $R_E$ and $R_A$ reflections in the direction of the surface wave beam can also be realized, leading to an advantage of increasing the freedom of choice for the counterpart IDT in the case of constructing a filter or the like.

Figure 7:
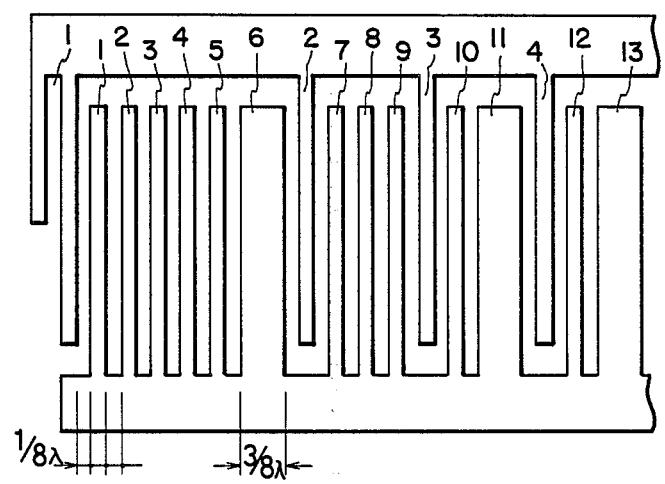
FIG. 7 is a front elevational view illustrating the electrode construction of a fourth embodiment in accordance with the present invention.

Referring to FIG. 7, there is shown another embodiment of the present invention in which the electrode type A (first arrangement region) and the electrode type B (second arrangement region) are distributed in the direction of propagation of the surface acoustic wave. As seen in FIG. 7, the upper or first comb-shaped electrode has at least first, second, third and fourth electrode strips (numbering from left to right in FIG. 7) extending at right angles to the direction of surface acoustic wave propagation. The lower or second comb-shaped electrode has at least first through thirteenth electrode strips interdigitated between adjacent electrode strips of the first comb-shaped electrode. In particular, first through sixth electrode strips of the second comb-shaped electrode are positioned between said first and second electrode strips of the first comb-shaped electrode; seventh through ninth electrode strips of the second comb-shaped electrode are positioned between said second and third electrode strips of the first comb-shaped electrode; tenth and eleventh electrode strips of the second comb-shaped electrode are positioned between said third and fourth electrode strips of the first comb-shaped electrode and twelfth and thirteenth electrode strips of the second comb-shaped electrode are positioned adjacent said fourth electrode strip of the first comb-shaped electrode. The sixth, eleventh, and thirteenth electrode strips of the second comb-shaped electrode have a width of $\frac{3}{8}\lambda$ whereas the width of the remaining strips of said first and second comb-shaped electrodes have a width of $\lambda/8$ with all strips of said first and second comb-shaped electrode being spaced apart by a distance of $\lambda/8$. Using a transducer with such a construction, it is possible to control the weighting of the excitation efficiency by the so-called electrode-strip withdrawal technique. In addition, it will be possible, corresponding to the wave form of the electric reflection in the above case, to control the pattern of the acoustic reflection region by the density distribution in the direction of propagation of the surface acoustic wave. With this construction, uniform power distribution along the direction of width of the surface wave beam is obtained for both the electric reflection $R_E$ and the acoustic reflection $R_A$ so that a nearly perfect reflection cancellation between $R_E$ and $R_A$ is accomplished. At the same time, it is possible to achieve a reduction in loss due to the absence of the so-called apodization loss. When the above IDT is applied to filters, the effects are found to be particularly conspicuous for narrow-band filters with specific band with less than 3%.

Figure 8:
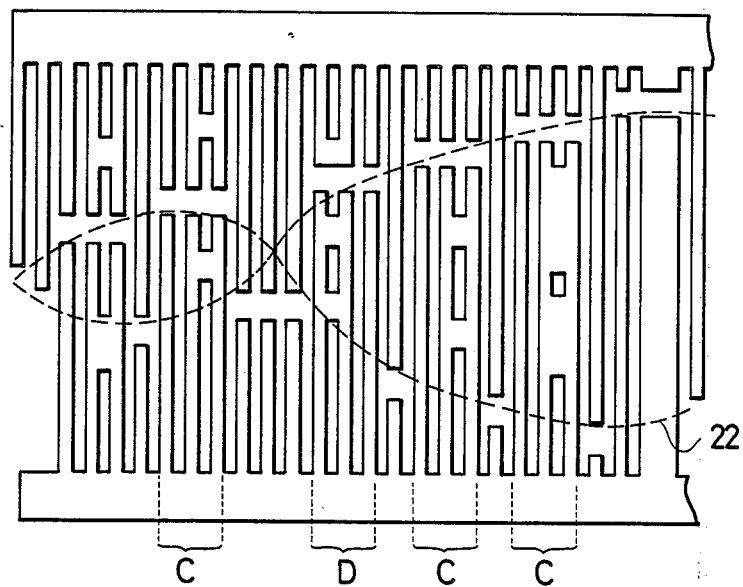
FIG. 8 is a front elevational view illustrating the electrode construction of a fifth embodiment in accordance with the present invention.

In the embodiments given in the foregoing, description was made for the case in which all the interdigitation widths of the electrode strips have a constant value. However, it is possible to apply the present invention to the case in which the interdigitation width varies along the direction of propagation of the surface wave, as shown by FIG. 8. In such a case, in contrast to the electric reflection which is generated from the region of interdigitation of the electrode strips, the acoustic reflection can be made to be generated from the region where there is no interdigitation of the electrode strips (the region of dummy electrode) also. In this case, the pattern for the region of acoustic reflection (the region of electrode strips with width $\lambda/8$ and $3\lambda/8$) may be determined roughly in the following manner. Namely, after determining the impulse response corresponding to the interdigitation region 22, the self-convolution is evaluated, and then it is sufficient to arrange the acoustic reflection range so as to correspond to the wave form with the time interval compressed to one half. In this case, together with the ordinary region (the region C of the figure) in which the electric reflection and the acoustic reflection have opposite phases, there may arise a region (region D of the figure) in which the electric reflection and the acoustic reflection are in phase. In an IDT with construction as shown in FIG. 8, it is possible to distribute unevenly the acoustically reflecting portion in the direction of the interdigitation width, in order to accomplish also the cancellation of $R_E$ and $R_A$ along the direction of the width of the surface wave beam.

It should be mentioned in the above description that it becomes necessary to take into account the change in the wave form of the electric reflection due to load conditions and the like of the exterior circuit, and also the effects on the acoustically reflected waves due to multiple reflections among the electrode strips. However, these effects may be analyzed by an equivalent circuit model for the IDT so that the final pattern determination could be made based on the result of such an analysis.

Figure 9:
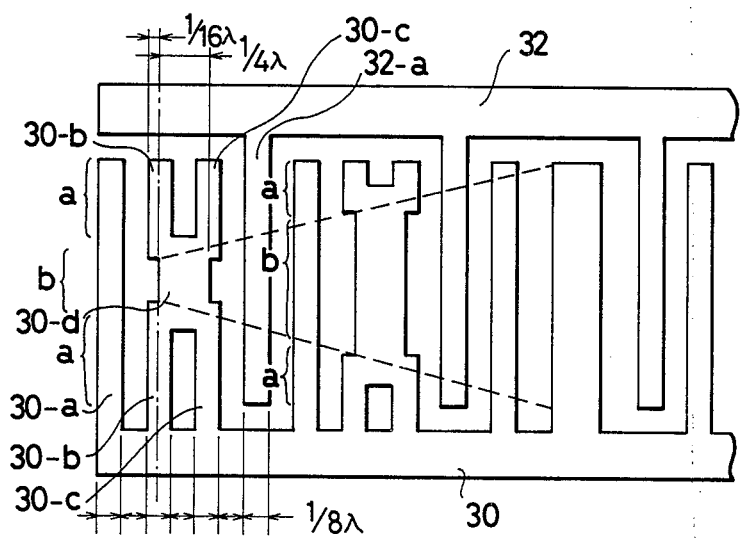
FIG. 9 is a front elevational view illustrating the electrode construction of a sixth embodiment in accordance with the present invention.

In still another embodiment of the present invention as shown by FIG. 9, the first type electrode-strips set A is formed by electrode strips with an approximate width of $\lambda/8$, while the second type electrode-strips set B is formed by a combination of electrode strips with widths of approximately $\lambda/8$ and approximately $\lambda/4$. The spurious reflection is reduced in this embodiment by arranging to give opposite phase to the resultant electric reflection and to the resultant vector of the acoustic reflections originating from the first type electrode-strip set A and the second type electrode-strip set B.

Namely, the first comb-shaped electrode 30 is constructed to have an electrode strip 30-a with approximate width $\lambda/8$ and an electrode strip 30-b with approximate width $\lambda/8$, spaced apart from each other for a distance of $\lambda/8$. Further, an electrode strip 30-d with approximate width $\lambda/4$ is arranged at a position about $\lambda/16$ away from the left-hand extremity of the electrode strip 30-b. These electrode strips 30-b, 30-c, and 30-d are constructed in a form which is short-circuited electrically. The second comb-shaped electrode 32 has a construction which is a repetition of the electrode strip 32-a with approximate width $\lambda/8$. In particular, the electrode strip 32-a with width $\lambda/8$ is arranged adjacent to the first comb-shaped electrode 30 at a distance $\lambda/8$ away from it.

In addition to the effects applicable to the embodiments described earlier, it is possible in this embodiment to obtain a transducer with large maximum acoustic reflection. Since it becomes possible then to increase also the amount of the electric reflection in comparison to the cases, it becomes possible to realize a surface acoustic wave transducer with still lower losses.

Although several embodiments of the surface acoustic wave transducers in accordance with the present invention have been described, the present invention will not at all be limited to these embodiments. Various modifications, such as joint use with multi-strip couplers (MSC), joint use with thin film dielectrics, application to piezo-electric films, use of grooves for the portion of the acoustic reflection and others will become possible for those skilled in the art after receiving the teachings of the present disclosure without departing from the scope thereof.

What is claimed is:

1. A surface acoustic wave transducer comprising:
   (a) a first comb-shaped electrode formed on one surface of said piezoelectric substrate and having a plurality of parallel electrode strips extending at right angles to the direction in which the surface acoustic wave propagates, said electrode strips each having a width of about $\lambda/8$, where $\lambda$ is the wave length of the surface acoustic waves; and
   (b) a second comb-shaped electrode formed on said piezoelectric substrate and having at least a first, a second and a third electrode strip interdigitated between the electrode strips of said first comb-shaped electrode, and having lengths extending parallel to said electrode strips of said first comb-shape electrode, said second and third electrode strips positioned adjacent one another and parts of said second and third electrode strips being connected together along their lengths, said first electrode strip not being connected to any strip in a region of the wave path in which said acoustic wave propagates,
   said first, second, and third electrode strips extending at right angles to the direction in which the waves propagate,
   said first, second, and third electrode strips each having a width of about $\lambda/8$ and being spaced apart from each other by a distance of about $\lambda/8$ except for said connected parts of said second and third electrode strips, said connected parts having a width of $3\lambda/8$,
   a first arrangement region from which only electric reflected waves are produced being formed by parts of the electrode strips of said first comb-shaped electrode, parts of the first electrode strip of said second comb-shaped electrode, and parts of the second electrode strip and the third electrode strip other than the connected parts,
   a second arrangement region from which an acoustic reflected wave and an electric reflected wave are simultaneously produced on opposed phases in cooperation with the electrode strip of said first comb-shaped electrode,
   and the second arrangement region being formed by the other parts of the electrode strips of said first comb-shaped electrode, the other parts of the first electrode strip of said second comb-shaped electrode, and the connected parts of the second and third electrode strips of said second comb-shaped electrode.

2. A transducer of claim 1 wherein the shared length of said electrode strips of said first arrangement region and the shared length of said electrode strips of said second arrangement region are so chosen, with respect to the propagation direction, that a sum of two electric reflected waves each produced from said first and second arrangement regions cancels out the acoustic reflected wave which is produced only from said second arrangement region.

3. A surface acoustic wave transducer comprising:
   (a) a first comb-shaped electrode formed on one surface of said piezoelectric substrate and having a plurality of parallel electrode strips including at least first, second, third and fourth electrode strips each extending at right angles to the direction in which the surface acoustic wave propagates, said electrode strips each having a width of about $\lambda/8$, where $\lambda$ is the wave length of the surface acoustic waves; and
   (b) a second comb-shaped electrode formed on said piezoelectric substrate and having:
      (1) first through fifth electrode strips each having a width of $\lambda/8$ and being spaced apart from each other by a distance of $\lambda/8$ and being positioned between said first and second electrode strips of said first comb-shaped electrode,
      (2) a sixth electrode strip having a width of $3\lambda/8$ and being spaced by a distance of $\lambda/8$ between said fifth electrode strip of said second comb-shaped electrode and said second electrode strip of said first comb-shaped electrode,
      (3) seventh through ninth electrode strips each having a width of $\lambda/8$ and being spaced apart from each other by a distance of $\lambda/8$ and being positioned between said second and third electrode strips of said first comb-shaped electrode,
      (4) a tenth electrode strip having a width of $\lambda/8$ and an eleventh electrode strip having a width of $3\lambda/8$, said tenth and eleventh electrode strips being spaced apart by a distance of $\lambda/8$ and positioned between said third and fourth electrode strips of said first comb-shaped electrode, and
      (5) a twelfth and thirteenth electrode strip positioned adjacent said fourth electrode strip of said first comb-shaped electrode, said twelfth electrode strip having a width of $\lambda/8$ and said thirteenth electrode strip having a width of $3\lambda/8$ and being spaced apart from one another by a distance of $\lambda/8$.

* * * * *